United States Patent [19]

Franken et al.

[11] 4,370,294

[45] Jan. 25, 1983

[54] COMPACTING PARTICULATE MATERIAL INTO A BODY

[75] Inventors: Jeffrey J. Franken, Birdsborough; Walter W. Gladney, Kutztown; William R. Yeich, West Lawn, all of Pa.

[73] Assignee: Western Electric Co., Inc., New York, N.Y.

[21] Appl. No.: 222,424

[22] Filed: Jan. 5, 1981

[51] Int. Cl.³ .............................................. B29C 1/04
[52] U.S. Cl. .................................... 264/571; 264/101; 264/102; 264/120; 264/313; 264/314
[58] Field of Search ............... 264/120, 101, 102, 313, 264/571, 314

[56] References Cited

U.S. PATENT DOCUMENTS

| | | | |
|---|---|---|---|
| 2,129,240 | 9/1938 | Sanborn | 264/120 |
| 2,298,908 | 10/1942 | Wentworth | 29/155.5 |
| 2,517,902 | 8/1950 | Luebkeman | 264/102 |
| 3,038,199 | 6/1962 | Bartow et al. | 264/102 |
| 3,608,026 | 9/1971 | Isaksson et al. | 264/109 |
| 3,804,575 | 4/1974 | Chandhok | 425/405 H |
| 4,009,977 | 3/1977 | Chao | 425/78 |
| 4,056,347 | 11/1977 | Trolle | 425/405 H |
| 4,097,977 | 7/1978 | Pollner | 29/25.12 |

*Primary Examiner*—James R. Hall
*Attorney, Agent, or Firm*—D. C. Watson

[57] ABSTRACT

In the growth of gadolinium gallium garnet monocrystals, a crucible is charged with a preformed body (65) of oxide powders to form a melt. In preparation therefor, the oxide powders are formulated into a typical particulate material (16) which is compacted into a body (65) having a desired size and shape. For holding material (16), there is provided a pouch (38) of a first size having elastic walls expandable to a second size, larger than body (65). The pouch (38) is disposed within a chamber (36) having inside walls conforming to the desired shape of the body (65) but of the second size. An open neck (42) of the pouch (38) extends through and is sealed to an opening (60) in chamber (36). Then a vacuum is drawn between the pouch (38) and chamber (36) to expand pouch (38) to said shape and second size formed by the chamber walls. As the particulate material (16) is introduced into the expanded pouch (38), such material conforms to the shape and second size of such expanded pouch. The vacuum is broken, permitting pouch (38) to compress the loaded material (16) and maintain the shape for subsequent compacting. The loaded pouch (38) is removed from the chamber (36) and is thereafter isostatically compacted with sufficient pressure to form the body (65) therewithin having the desired size and shape.

7 Claims, 6 Drawing Figures

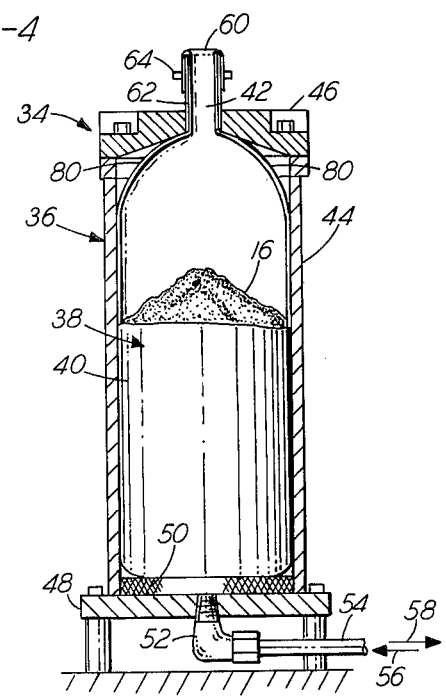
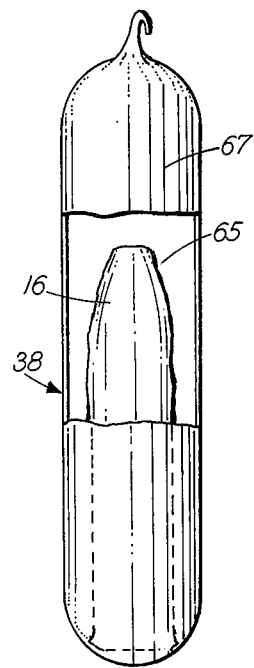
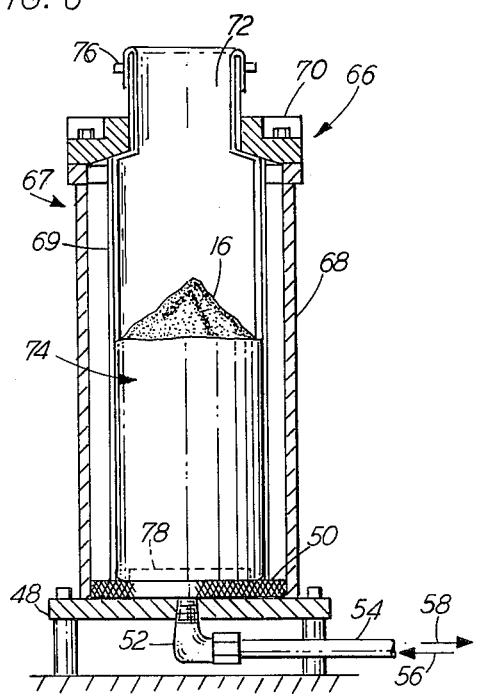

COMPACTING PARTICULATE MATERIAL INTO A BODY

TECHNICAL FIELD

This invention relates to compacting particulate material into a body having a desired size and shape. More particularly, this invention relates to compacting oxide powders into a body from which a melt is made for growing monocrystals in the electronics industry.

BACKGROUND OF THE INVENTION

Magnetic bubble memory devices are formed in epitaxial layers grown on gadolinium gallium garnet substrates. Such substrates are prepared from elongated monocrystals grown according to the well known Czochralski technique by pulling a seed rod from a melt. The melt is contained in an expensive iridium crucible, which is quite small and yet must contain sufficient melt to grow a monocrystal of a practical size. The problem is that the components of material for charging the crucible are primarily powders of $Gd_2O_3$ and $Ga_2O_3$ having a high ratio of voids to solids in their natural state. Consequently, it is essential to compact the materials to fit the small crucible so that sufficient melt is produced in a single step charging procedure followed by meltdown.

Conventionally, a proper mixture of powder was funnelled into elongated rubber pouches referred to as "bladders." The bladders were then sealed and placed in a pressure vessel filled with a slightly oily solution. The vessel was mechanically sealed and more solution was pumped into the vessel until the pressure therein rose to about 18,000 psi. The machine which includes the vessel and pump was referred to as an isostatic compactor because all surfaces of the bladder received application of the same amount of pressure. At least one body referred to as a "stick" of compacted powder was produced in the conventional procedure which stick measured from about 1.2 to about 1.5 inches in diameter and was about 8 inches long. Bundles of such sticks, were vertically disposed on top of broken sticks in an iridium crucible for meltdown. The problem was that the procedure was time consuming and the sticks were irregular in shape so they did not always melt down uniformly. Consequently, an unmelted part of a stick sometimes toppled out of the crucible causing damage to furnace equipment. It is preferable to prepare a singular, well defined body of compacted powder for each charge such that the posture of the body will be stable during meltdown.

SUMMARY OF THE INVENTION

In view of the foregoing, it is an object of this invention to provide new and improved methods and apparatus for compacting particulate material into a body. Another object is to compact material into a body having a well defined shape. A further object is to form such a body of sufficient mass that a desired quantity of melt can be obtained from one such body during meltdown.

With these and other objects in mind, the present invention includes the step of forming a pouch of a first size, having elastic wall material expandable to a second size, larger than the desired body and having an opening in a first end of the pouch. The pouch is disposed within a chamber having inside walls conforming to the desired shape of the body but of the second size. The first end of the pouch is extended through an opening in the chamber and the walls of the first end are sealed to the walls of the opening. Consequently, the interior of the pouch is accessible from outside the chamber. A sufficient vacuum condition is formed between the pouch and chamber to substantially elastically expand the pouch to the size and shape of the inside walls of the chamber. The particulate material is introduced into the pouch to load it, said material substantially conforming, as it is introduced, to the shape and second size of the expanded pouch. Air is introduced into the chamber to break the vacuum condition, thereby permitting the pouch to compress the loaded material and maintain the shape for subsequent compacting.

In a further embodiment, the loaded pouch is removed from the chamber and is then compacted to form the body therewithin having the desired size and shape.

In another embodiment, the desired shape of the body is that of a vertically disposed cylinder having at least one flat end. The flat end is achieved, in a further embodiment, by disposing a flat disc at a second end of the pouch and the compacting step includes forming a flat surface on a second end of the body.

In another embodiment, substantially smooth, porous surfaces form the shape having the second size within the chamber and the vacuum forming step includes removing air from between the chamber and the smooth, porous surfaces. Such removal is sufficient to substantially elastically expand the pouch to the size and shape of the porous surfaces.

BRIEF DESCRIPTION OF THE DRAWINGS

The above-described and other objects, advantages, and features of the invention will be more readily understood from the following detailed description when read in conjunction with the accompanying drawing, wherein:

FIG. 4 is the same view as FIG. 3 except that a vacuum has been drawn on the chamber to expand the pouch and loading has begun.

FIG. 5 is a cut-away, elevational view of a large pouch containing a large compacted body in accordance with the instant invention.

FIG. 6 is a view similar to FIG. 4, of a larger chamber wherein smooth porous surfaces form the shape having the second size and a flat disc has been disposed within the pouch at a second end thereof.

Figure 1:
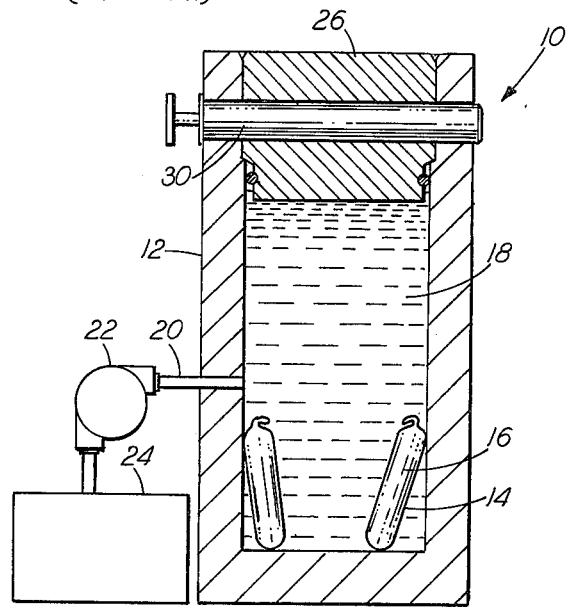
FIG. 1 is a cross-sectional view of an isostatic pressure apparatus with prior art small pouches of powder being compacted therein.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

Prior Art

FIG. 1 illustrates a cross-sectional view of an isostatic pressure apparatus designated generally by the numeral 10. A heavy walled vessel 12 contains one or more pouches 14 used in the prior art to enclose material 16 to be compacted. After the pouches 14 are placed as shown, the vessel 12 is filled with a pressure fluid 18 which contains a lubricating oil. A pump 22 moves the fluid 18 from a source 24, such as a mixing reservoir, into vessel 12 through a port 20. The oil is required to lubricate parts of pump 22 and various controls (not shown).

A heavy cap 26 is installed in a top opening in vessel 12 and a large pin 30 is thrust through vessel 12 and cap 26 to stabilize the cap against pressure thereupon. Air is relieved from vessel 12 by apparatus (not shown) as fluid 18 is introduced therein by pump 22. Pressure is provided by pump 22 which is transmitted by the virtually incompressible fluid 18 to the inside surfaces of vessel 12 and to all outside surfaces of pouches 14. At about 18,000 psi, adequate compaction of material 16 is achieved, the pressure is relieved, and the pouches 14 are removed therefrom. A typical machine which includes such apparatus is sold by Autoclave Engineers, Erie, Pennsylvania, as their Assembly IP 6-23-30.

In the growth of monocrystalline gadolinium gallium garnet (GGG), the material 16, is typically, primarily a mixture of $Gd_2O_3$ and $Ga_2O_3$ in powder form. The two oxides are proportioned on a weight basis to obtain a ratio of about 3 moles of $Gd_2O_3$ to about 5 moles of $Ga_2O_3$. The mixture is light and fluffy with a high ratio of voids to solids and a bulk specific gravity of about 1 which, after compaction, rises to about 6.

The pouches 14 are typically about 2 inches in diameter and about 12 inches long including a 0.5 inch diameter by 2 to 3 inch long necked opening, useful for obtaining a seal. The wall material of pouches 14 is typically natural rubber which affords good elasticity and chemical resistance both to the oxides and to the oily pressure fluid.

Figure 2:
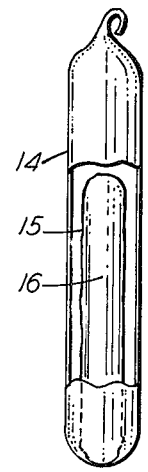
FIG. 2 is a cut-away, elevational view of a prior art small pouch containing a small compacted body.

FIG. 2 shows a cut-away, elevational view of a pouch 14 after it has been removed from apparatus 10. Note that the pouch 14 is still sealed and the air which was forced out of material 16 to form a body 15 remains in pouch 14. After compaction the bodies 15 are stored in pouches 14 to maintain cleanliness and the pouches 14 are later cut open to extract the bodies 15. A body 15, called a "stick," measures about 1.2 to about 1.5 inches in diameter by about 8 inches long and it is irregular in shape with rounded ends.

Before the elastic pouches 14 were used to compact material 16, more rigid containers were used in attempts to acquire well shaped bodies of oxides. For example, cylindrical polyurethane containers having clamped end caps were used in such attempts. However, the polyurethane walls often developed stress cracking and the clamped caps sometimes leaked, whereby the preformed bodies became wet and unusable. Nevertheless, some bodies were formed thereby having a desirable size and shape for charging crucibles in GGG work.

Compacting Large Bodies of Powder

To grow a typical monocrystalline ingot having a 2 inch diameter by 10 inch long body portion, about 6,000 to 7,000 grams of material 16 is charged into a crucible by any convenient method. For example, odd pieces of monocrystal may be charged along with broken sticks of powder and full sticks in bundles may be disposed thereon. The industry is now moving toward larger crucibles and larger charges from which 3 inch diameter crystals are being grown. For example, to grow an ingot having a 3 inch diameter by 10 inch long body portion, about 11,000 to 13,000 grams of material 16 is charged into a 5.8 inch diameter by 5 inch high crucible. Consequently, it is desirable to develop bodies of compacted powder which are larger in size and have a better shape than those of the prior art.

Figure 3:
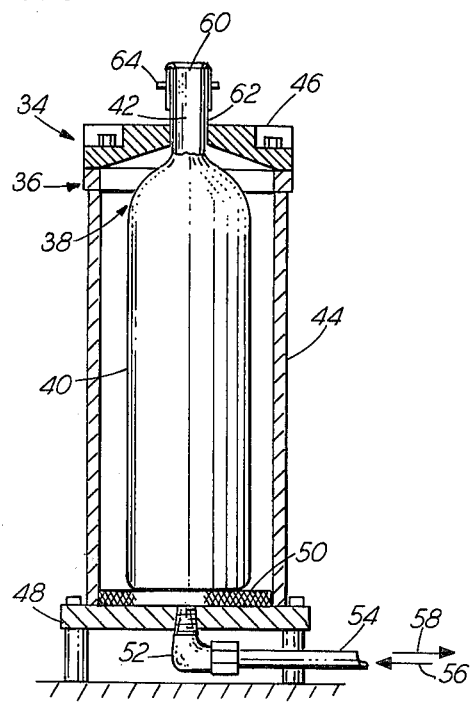
FIG. 3 is a cross-sectional view of a vacuum chamber and a pouch according to the instant invention.

FIG. 3 illustrates apparatus designated generally by the numeral 34, for developing moderately sized bodies of compacted powder in accordance with the instant invention. A vacuum chamber designated generally by the numeral 36 supports a pouch designated generally by the numeral 38 for enclosing material 16 (not shown). It will be seen that the size and geometrical shape of pouch 38, the inside surfaces of chamber 36, and a desired body of compacted powder are somewhat interrelated.

The unstressed size of pouch 38 is large enough to permit expansion thereof to the inside surfaces of chamber 36 while not substantially exceeding the elastic limits of the pouch wall material. Also, such unstressed size is small enough to cause pouch 38 to contract about and compressively contact material 16 after pouch 38 has been expanded and loaded. The internal size of chamber 36 relates to the size of a compacted body of material 16 desired to prepare a melt. Such relationship depends upon the components of material 16, the condition and formulation of such components, and the apparatus for compacting material 16 into the desired body. Of course the shape of pouch 38 is conformable to the internal shape of chamber 36 which internal shape is selected to obtain a desired shape of a compacted body. For example, to obtain a body having a vertically disposed, cylindrical shape with at least one flat end, the inside surfaces of chamber 36 may have the appearance shown in FIG. 3.

For GGG work, the oxide powders in the 3:5 molar formulation are compacted into a moderately sized body using the apparatus shown in FIGS. 1 and 3. To obtain a cylindrical shape of a body which is about 2.5 inches diameter, the size relationships are applied to select the apparatus 34 shown in FIG. 3. Pouch 38 preferably includes a body portion 40 which is about 3 inches in diameter and about 16 to 18 inches long and a neck portion 42 which is about 2 inches in diameter and about 2 to 3 inches long. The wall material is made of an elastic material such as natural rubber and the wall thickness is about 0.015 to about 0.020 inches. Pouches 38 having the preferred characteristics are sold by Trexler Rubber Company, Revenna, Ohio, without special trade designation.

Chamber 36 includes a body portion 44 and a lid 46 supported by a base 48. The body portion 44 is about 4.0 inches I.D. by about 16 inches long and a necked opening 60 is formed in lid 46 using a tube section 62 which is about 1.8 inches O.D. and is about 2 inches long. A smooth, porous plate 50 is installed in chamber 36 over a bottom tube fitting 52 from which a tube 54 connects to a selective air removal or supply source (not shown). Arrows 56 and 58 indicate application of air to or removal of air from chamber 36 through tube 54.

A pouch 38 is supported in chamber 36 with the neck 42 extended through opening 60 and the wall material of the neck is sealed to tube 62 by drawing the elastic wall material thereover and fastening a snap ring 64 therearound. The interior of pouch 38 is accessible from the outside of chamber 36 yet the space intermediate the pouch 38 and chamber 36 is hermetically sealed.

FIG. 4 shows apparatus 34 after a vacuum has been drawn through tube 54 according to arrow 58. Pouch 38 has expanded under atmospheric pressure to substantially conform to the inside surfaces of chamber 36. Note, in this condition, that pouch 38 has the desired shape of a cylinder but it is of a second size, larger than the size desired for the body of compacted material 16.

While pouch 38 is expanded as shown in FIG. 4, it is loaded with a desired quantity of powder through opening 60 provided therefor. The material 16, as it is introduced into pouch 38, substantially conforms to the shape of the expanded pouch. It is preferable, although not necessary, to substantially fill the expanded pouch 38, thus substantially achieving the second size. Nevertheless, if a short body is to be obtained, one may want to load the pouch to less than a full condition.

After the desired quantity of the material 16 has been loaded, air is introduced into the space intermediate pouch 38 and chamber 36, thereby permitting the elastic walls of pouch 38 to compressively contract around the loaded material 16. Such contraction and compression essentially maintains the shape for subsequent compaction into the desired body size and shape. The loaded pouch 38 is removed from chamber 36 and the neck portion 42 is folded over and/or tied to seal the contents.

FIG. 5 shows a cut-away, elevational view of a loaded pouch 38 which has been compacted until a body 65 has been formed therewithin. Such body 65 has the general shape of a vertically disposed cylinder which is about 2.5 inches in diameter and about 10 to 11 inches long. The bottom end is substantially flat so the body will stand within a crucible with acceptable posture during meltdown. The size of the body is sufficient to properly fill a crucible with melt so that a moderately sized 2 inch diameter ingot weighing about 5,000 to 6,000 grams can be grown therefrom.

Alternate Embodiments

The invention, as heretofore described, could be referred to as a basic embodiment which provides substantial improvements over the prior art. Nevertheless, the basic embodiment should not be considered to be the only embodiment, nor does it contain all the presently preferred aspects and features of the invention. For example, the pouch 38 has a relatively narrow neck which is preferred in the basic embodiment because it facilitates proper sealing of pouch 38 before compaction begins. Nevertheless, such neck is not indispensable to the sealing step and it may be eliminated in an alternate practice of the invention. FIG. 6 shows an alternate embodiment where certain advantages are obtained by eliminating the narrow neck portion of a pouch.

An alternate apparatus, designated generally by the numeral 66, contains certain features which are different than those in the basic embodiment and such features are given different numerical designations. Apparatus 66 is primarily developed to obtain a better defined shape of a body of compacted material 16 than body 65 (FIG. 5), taking into account certain practical aspects of operation. For example (FIG. 4), if a pouch 38 is oversized with respect to the vacuum chamber 36, it is possible to get sealing of the lower portion of pouch 38 to the chamber walls before the upper portion of the pouch fully expands. Incompletely expanded portions 80 can then occur and the shoulders of a compacted body 65 (FIG. 5) can become somewhat narrowed. A solution to this problem is to better distribute the application of vacuum throughout the walls of chamber 36.

Also, in the development of taller bodies of compacted material 16, it is desirable to ensure that the support areas of such bodies will always have a known flattened condition. A solution to this problem is to dispose a non-deformable member having a specific shape within a pouch before the material is introduced. Then the member is held at the area and the desired flattened condition is formed at the area during the compacting step.

Referring again to FIG. 6, apparatus 66 includes a chamber 67 having a body portion 68 which is about 5 inches inside diameter to obtain a compacted body of about 2.5 inches in diameter, similar to the size of body 65 (FIG. 5). Within the chamber 67, substantially smooth, porous surfaces 69 and 50 form the second size and shape, similar to that of the inside wall surfaces of body portion 44 of chamber 36 (FIG. 4). Chamber 67 further includes a lid 70 having a tubular opening 72 which is about 3 inches in diameter within the tube.

There is shown in chamber 67 a pouch 74, which is about 3 inches in diameter by about 20 inches long and which has an opening without a neck portion when it is unstressed (not shown unstressed). The pouch 74 has been disposed within chamber 67 and within the porous surfaces 69 and 50. A top open portion of pouch 74 extends through the tubular opening 72 and the walls of the pouch have been folded over the walls of the tube. A large snap ring 76 has been installed therearound to seal the pouch walls to the tube walls. Thereafter, air has been removed according to arrow 58 through tube 54, fitting 52, porous plate 50, and porous surfaces 69 to permit pouch 74 to expand under atmospheric pressure. Such removal is sufficient to thoroughly deplete air from between the chamber 67 and the smooth, porous surfaces 69 and 50 to elastically expand pouch 74 to the size and shape of such surfaces as shown. A substantially non-deformable, flat disc 78, which is about 2.8 inches in diameter, is then disposed within pouch 74 before material 16 is introduced therein. Thereafter loading takes place, the vacuum is broken, and the pouch is sealed. Then compacting takes place as is done in the basic embodiment except that flat disc 78 is pressed directly upon material 16 to obtain a known condition at the lower end of a compacted body.

It will be appreciated that the second size and shape to which pouch 74 expands is defined with predictable assurance in the method illustrated according to FIG. 6. Also, it will be appreciated that the lower end of a body of compacted powder obtained with disc 78 has a predictably flattened surface. It will be evident that other surfaces such as surfaces 69 and 50 could take other sizes and shapes. Also, other non-deformable members, for example, split, cylindrical casings, could be disposed in a pouch 74 to obtain a desired surface condition on a compacted body of material 16.

For purposes of illustration the invention has been described in detail with respect to the preferred mixture of oxides for GGG work to obtain a body 65 (FIG. 5) suitable for growing moderately sized monocrystals. In such work the second size of a body of material 16, before it is compacted is from about 1.4 to about 2.0 times the desired size of a body 65, depending upon the condition of the mixed material 16 and the degree of compaction achieved. Given this and other criteria set forth herein, apparatus 34 (FIG. 4) or apparatus 66 (FIG. 5), can be scaled upward to obtain more massive bodies of compacted material 16, using the preferred or other formulations of oxide powders.

There have been illllustrated herein certain embodiments of the invention and certain applications thereof.

Nevertheless, it is to be understood that various modifications and refinements may be made and used which differ from these disclosed embodiments without departing from the spirit and scope of the present invention.

For example, it will be apparent that the invention is not limited to compacting oxide powders but may be readily adapted for use with other materials. Further, it will also be understood that certain specific dimensions and other parameters disclosed hereinbefore are not critical to the invention, but are merely for specific illustration.

What is claimed is:

1. A method of forming compactable material into a body having a desired size and shape, comprising:
    providing a pouch of a first size, having elastic walls of sufficient strength to at least partially compact the material, such walls being expandable to a second size, larger than the desired body, and having a necked opening therein at a first end of the pouch;
    disposing the pouch within a chamber having inside walls conforming to the desired shape of the body but of the second size, the first end of the pouch extending through a necked opening in said chamber and the walls of the first end being sealed to the walls of the opening such that the interior of the pouch is accessible from outside the chamber;
    forming a sufficient vacuum condition between the pouch and chamber to substantially elastically expand the pouch to the size and shape of the inside walls of the chamber;
    introducing the material into the pouch to load the same, said material substantially conforming, as it is introduced, to the shape and second size of the expanded pouch; and
    introducing air into the chamber to break the vacuum condition, thereby permitting the pouch to compress the loaded material and maintain the shape for further compacting into the desired body size and shape.

2. The method of claim 1 further including the steps of:
    removing the loaded pouch from the chamber; and
    further compacting the loaded pouch with sufficient pressure to form the body therewithin having the desired size and shape.

3. The method of claim 2, wherein the desired shape of the body is substantially that of a vertically disposed cylinder having at least one flat end.

4. The method of claim 3, wherein at least one substantially non-deformable member having a specific shape is disposed within the pouch before the step of introducing the material and wherein the compacting step further comprises:
    holding the member at an area in the pouch and forming a desired surface condition on at least one area of the body by compacting the member against the material at the area.

5. The method of claim 4, wherein the member is a flat disc disposed at a second end of the pouch and the compacting step includes forming a flat surface on the end of the body whereat the flat disc is disposed.

6. The method of claim 3, wherein substantially smooth, porous surfaces form the shape of the body but of the second size within the chamber, further comprising, as part of the vacuum forming step:
    removing sufficient air from between the chamber and the smooth, porous surfaces to substantially elastically expand the pouch to the size and shape of the porous surfaces.

7. The method of claim 3, wherein the material is essentially a mixture of $Ga_2O_3$ and $Gd_2O_3$ powder of the type used to grow gadolinum gallium garnet crystals and wherein the second size of the desired shape of a body is from about 1.4 to about 2.0 times the desired size of the body.

* * * * *